United States Patent
Then et al.

(10) Patent No.: US 10,861,942 B2
(45) Date of Patent: Dec. 8, 2020

(54) TUNABLE CAPACITORS INCLUDING III-N MULTI-2DEG AND 3DEG STRUCTURES FOR TUNABLE RF FILTERS

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 280 days.

(21) Appl. No.: 15/774,522

(22) PCT Filed: Dec. 9, 2015

(86) PCT No.: PCT/US2015/064630
§ 371 (c)(1),
(2) Date: May 8, 2018

(87) PCT Pub. No.: WO2017/099737
PCT Pub. Date: Jun. 15, 2017

(65) Prior Publication Data
US 2020/0203488 A1    Jun. 25, 2020

(51) Int. Cl.
*H01L 29/20*    (2006.01)
*H01L 29/10*    (2006.01)
(Continued)

(52) U.S. Cl.
CPC ...... *H01L 29/2003* (2013.01); *H01L 29/1037* (2013.01); *H01L 29/205* (2013.01);
(Continued)

(58) Field of Classification Search
CPC ............. H01L 29/1037; H01L 29/2003; H01L 29/205; H01L 29/7787; H01L 29/972; H01L 29/94; H03H 7/0169
See application file for complete search history.

(56) References Cited

U.S. PATENT DOCUMENTS 6,541,797 B1 *   4/2003   Udagawa ............... H01L 33/06
                                                      257/101
2005/0285098 A1   12/2005   Fathimulla et al.
(Continued)

FOREIGN PATENT DOCUMENTS

| JP | 2009507362 A | 2/2009 |
| TW | 201535715 | 9/2015 |
| WO | 2017/099737 A1 | 6/2017 |

OTHER PUBLICATIONS

International Search Report and Written Opinion received for PCT Application No. PCT/US2015/064630, dated Aug. 18, 2016. 13 pages.
(Continued)

*Primary Examiner* — Allan R Wilson
(74) *Attorney, Agent, or Firm* — Finch & Maloney PLLC (57) ABSTRACT

Techniques are disclosed for forming tunable capacitors including multiple two-dimensional electron gas (2DEG) and three-dimensional electron gas (3DEG) structures for use in tunable radio frequency (RF) filters. In some cases, the tunable capacitors include a stack of group III material-nitride (III-N) compound layers that utilize polarization doping to form the 2DEG and 3DEG structures. In some instances, the structures may be capable of achieving at least three capacitance values, enabling the devices to be tunable. In some cases, the tunable capacitor devices employing the multi-2DEG and 3DEG structures may be a metal-oxide-semiconductor capacitor (MOSCAP) or a Schottky diode, for example. In some cases, the use of tunable RF filters
(Continued)

employing the multi-2DEG and 3DEG III-N tunable capacitor devices described herein can significantly reduce the number of filters in an RF front end, resulting in a smaller physical footprint and reduced bill of materials cost.

20 Claims, 7 Drawing Sheets

(51) Int. Cl.
*H01L 29/205* (2006.01)
*H01L 29/778* (2006.01)
*H01L 29/872* (2006.01)
*H01L 29/94* (2006.01)
*H03H 7/01* (2006.01)

(52) U.S. Cl.
CPC ........ *H01L 29/7787* (2013.01); *H01L 29/872* (2013.01); *H01L 29/94* (2013.01); *H03H 7/0169* (2013.01); *H03H 2210/025* (2013.01)

(56) References Cited

U.S. PATENT DOCUMENTS

| | | |
|---|---|---|
| 2009/0189188 A1 | 7/2009 | Matsushita |
| 2011/0012173 A1* | 1/2011 | Umeda ............. H01L 29/41766 |
| | | 257/192 |
| 2014/0159119 A1* | 6/2014 | Derluyn ............ H01L 29/66462 |
| | | 257/194 |
| 2014/0252368 A1* | 9/2014 | Lee ................... H01L 29/66462 |
| | | 257/76 |
| 2014/0266324 A1 | 9/2014 | Teo et al. |
| 2014/0326951 A1* | 11/2014 | Bunin ............... H01L 29/42316 |
| | | 257/20 |
| 2015/0187924 A1 | 7/2015 | Dasgupta et al. |
| 2017/0309736 A1* | 10/2017 | Huang ................. H01L 29/155 |

OTHER PUBLICATIONS

International Preliminary Report on Patentability received for PCT Application No. PCT/US2015/064630, dated Jun. 12, 2018. 9 pages.

* cited by examiner

TUNABLE CAPACITORS INCLUDING III-N MULTI-2DEG AND 3DEG STRUCTURES FOR TUNABLE RF FILTERS

BACKGROUND

Radio frequency (RF) filters are an important component in modern communication systems. With the growing number of bands and modes of communications, the number of RF filters in a mobile device front end can multiply quickly. Resonators, such as film bulk acoustic resonators (FBAR), sometimes referred to as thin-FBAR (TFBAR), are the components that are used to make RF filters. For example, one RF filter may include up to seven FBAR devices arranged in various configurations (e.g., a half-ladder circuit configuration). An FBAR or TFBAR is a device consisting of a piezoelectric material located between two electrodes and acoustically isolated from the surrounding medium. An example RF front end covering 2G/3G and 4G mobile telecommunications technologies may contain seventeen RF filters, which can result in a total of 119 FBARs, for example.

BRIEF DESCRIPTION OF THE DRAWINGS

FIGS. 3A-B illustrate example RF front end architectures, in accordance with some embodiments of this disclosure. More specifically.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming tunable capacitors including multiple two-dimensional electron gas (2DEG) and three-dimensional electron gas (3DEG) structures for use in tunable radio frequency (RF) filters. In some cases, the tunable capacitors include a stack of group III material-nitride (III-N) compound layers that utilize polarization doping to form the 2DEG and 3DEG structures. For example, the material of the channel layers in the structures may include gallium, such as gallium nitride (GaN) and/or indium gallium nitride (InGaN), as such materials have wide bandgaps and other desirable properties for forming multi-2DEG and 3DEG structures. In some instances, the structures may be capable of achieving at least three capacitance values, enabling the devices to be tunable. In some cases, the tunable capacitor devices employing the multi-2DEG and 3DEG structures may be a metal-oxide-semiconductor capacitor (MOSCAP) or a Schottky diode, for example. In some cases, the tunable capacitor devices may have a planar configuration, while in other cases, the tunable capacitor devices may have a non-planar configuration, such as a finned configuration (e.g., where the channel of the device resides on the outer portions of the fin) or a nanowire/nanoribbon configuration (e.g., where the channel of the device is around the outside of the at least on nanowire/nanoribbon). In some cases, the use of tunable RF filters employing the multi-2DEG and 3DEG III-N tunable capacitor devices described herein can significantly reduce the number of filters in an RF front end, resulting in a smaller physical footprint and reduced bill of materials cost. Numerous variations and configurations will be apparent in light of this disclosure.

General Overview

RF filters continue to be a major factor in the costs of RF front end and the total integrated circuit (IC) area available, particularly in light of 5G mobile telecommunication technology on the horizon. The use of tunable or variable RF filters can significantly reduce the number of RF filters in RF front end, which results in a much smaller footprint enabling small form factors for mobile devices as well as reduced bill of materials cost. Gallium arsenide (GaAs) Schottky diodes and silicon (Si) p-n varactors have been utilized as tunable capacitive elements for tunable RF filters. However, such GaAs and Si tunable capacitors have undesired limitations. For example, GaAs and Si tunable capacitors can only work with small voltages due to the small bandgaps of the materials (1.42 and 1.1 eV, respectively). For large breakdown voltages, such as the approximately 35V used for RF front end (e.g., in mobile handsets), GaAs and Si tunable capacitors have to employ large spaces between the contacts, which adds resistance and thereby degrades the quality factor (Q-factor) of the capacitor. Further, such GaAs and Si tunable capacitors may not be able to achieve the desired number of distinct capacitance values to, for example, achieve a tunable RF filter with the desired number of distinct RF band filters.

Thus, and in accordance with one or more embodiments of this disclosure, techniques are provided for forming tunable capacitors including multi-2DEG and three-dimensional electron gas (3DEG) structures for use in tunable RF filters. A tunable or variable capacitor can intentionally and repeatedly have its capacitance changed. As can be understood based on this disclosure, a 2DEG configuration includes a gas of carriers (e.g., electrons or holes) free to move in two dimensions but tightly confined in the third. Such a tight confinement can lead to quantized energy levels for motion in the third. As can also be understood based on this disclosure, 3DEG can be achieved using polarization doping (e.g., via compositional grading) that creates a three-dimensional distribution doping profile. 2DEG and 3DEG, as variously used herein, includes two-dimensional hole gas (2DHG) and three-dimensional hole gas (3DHG), respectively, in some embodiments, but 2DEG and 3DEG will be used herein to generally refer to both carrier types (electrons and holes) for ease of description. In some embodiments, the tunable capacitor devices may utilize group III element-nitride (III-N) compounds/materials. As can be understood based on this disclosure, III-N materials, such as gallium nitride (GaN) may be particularly well-suited for a tunable capacitive element, due to III-N materials having wide/high bandgaps (e.g., 3.4 eV for GaN) and other desirable properties. Further, III-N materials, due to polarization doping, may enable fabrication of capacitive element structures that employ 2DEG and 3DEG configurations, and such 2DEG and 3DEG distributions of charges may enable the capacitive elements to be tunable, for example. III-N materials, as variously used herein, include a compound of one or more group III materials (e.g., aluminum, gallium, and/or indium), with nitrogen. Accordingly, III-N materials/compounds as variously used herein include, but are not limited to, GaN, InN, AlN, AlInN, AlGaN, InGaN, and AlInGaN.

In some embodiments, the tunable capacitive devices employing the multi-2DEG and/or 3DEG structures may be capacitor devices, such as metal-oxide-semiconductor capacitors (MOSCAPs), or diodes, such as Schottky diodes, for example. In some such embodiments, the tunable capacitive device may be a 3DEG III-N Schottky diode, a multi-2DEG III-N Schottky diode, a 3DEG III-N MOSCAP, or a multi-2DEG III-N Schottky diode, as will be described in more detail herein. In some embodiments, a single 2DEG structure may be used for the tunable capacitive element, but such a structure may only be able to achieve two levels of tunable capacitance. Therefore, in some embodiments, to achieve additional levels of tunable capacitance, multi-2DEG and 3DEG structures may be used. For example, as can be understood based on this disclosure, a tunable capacitive element including a 3DEG structure may be able to achieve three distinct capacitance values, which may be achieved by applying distinct gate voltages to the element. As can also be understood based on this disclosure, a tunable capacitive element including at least two 2DEG structures may be able to achieve four distinct capacitance values, which may be achieved by applying different gate voltages to the element. Further, additional capacitance values could be achieved by a tunable capacitive device by including additional 2DEG structures and/or additional 3DEG structures, for example. For instance, in an example embodiment, a tunable capacitive device may include both 2DEG and 3DEG structures. In some embodiments, a tunable capacitor device as variously described herein (e.g., with 3DEG and/or 2DEG structures) may have a planar configuration. In some embodiments, a tunable capacitor device as variously described herein (e.g., with 3DEG and/or 2DEG structures) may have a non-planar configuration. In some such embodiments, the tunable capacitor device may have a finned/tri-gate or nanowire/nanoribbon/gate-all-around configuration. In some embodiments, a tunable RF filter may include the tunable capacitive devices variously described herein, such as those including any number of 2DEG and/or 3DEG structures.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging or tomography, local electrode atom probe (LEAP) techniques, 3D tomography, high resolution physical or chemical analysis, to name a few suitable example analytical tools. In particular, in some embodiments, such tools may indicate a structure or device configured with a tunable capacitive element including a multi-2DEG and/or 3DEG structure as variously described herein. In embodiments including a multi-2DEG structure, the device may include at least two III-N channel layers and corresponding polarization layers thereon. In embodiments including a 3DEG structure, the device may include a III-N channel layer and a polarization layer thereon, as well as a graded layer below the channel layer, such as a graded indium gallium nitride (InGaN) layer where the content of indium is graded through the layer (e.g., $In_xGa_{1-x}N$, where x is graded from 0 at/near the bottom to 30% at/near the top of the layer). In some such embodiments, the channel layers may include gallium (e.g., GaN, InGaN) and the polarization layers may include aluminum (e.g., AN, AlInN, AlGaN, AlInGaN). In some embodiments, the number of distinct capacitance values able to be achieved using the tunable capacitor may include at least 3, 4, 5, 6, 8, 10, or 12 distinct values, for example. In some embodiments, tunable capacitor devices variously described herein, as well as tunable RF filters employing such devices, may have improved Q-factors as a result of using III-N materials, for example. Accordingly, a tunable RF filter including such tunable capacitor devices may be able to replace 2, 3, 4, 5, 6, 8, 10, or 12 non-tunable RF filters, depending on the end use or target application. The devices and structures variously described herein may be used for numerous different applications, such as for mobile/smart phones, tablet computers, wearable computing devices (e.g., smart watch or smart glasses), or RF base stations, to name a few example applications. Numerous benefits, configurations, and variations will be apparent in light of this disclosure.

Architecture and Methodology

FIGS. 1A-E illustrate example integrated circuit structures used to form a tunable capacitor device including a 3DEG structure, in accordance with some embodiments of this disclosure. FIGS. 2A-E illustrate example integrated circuit structures used to form a tunable capacitor device including multiple 2DEG structures, in accordance with some embodiments of this disclosure. As will be apparent in light of this disclosure, in the example embodiments of FIGS. 1A-E and 2A-E, the tunable capacitor devices utilize III-N materials and polarization doping to achieve the 3DEG and multi-2DEG structures. Such 3DEG and multi-2DEG distributions of charges in the III-N materials enables capacitor devices to be tunable, as will also be apparent in light of this disclosure. For example, a 3DEG configuration and/or a multi-2DEG configuration may allow for at least 3 distinct capacitance values to be achieved. Note that in some embodiments, the structures of FIGS. 1A-D and 2A-D may be used for tunable capacitor devices having planar configurations or tunable capacitor devices having non-planar configurations. Embodiments including non-planar configurations will be described in more detail herein, specifically with reference to FIGS. 1E and 2E. In some embodiments, the tunable capacitor devices variously described herein may be employed as a tunable capacitive element in a tunable RF filter, for example. Further, in some such embodiments, the tunable RF filters may be used to reduce the number of RF filters included in an RF front end, as will be described in more detail with reference to FIGS. 3A-B, for example. As will be apparent in light of the present disclosure, the techniques as variously described herein may be used with devices of varying scales, such as tunable capacitor devices in the micrometer range or devices in the nanometer range.

Figure 1A:
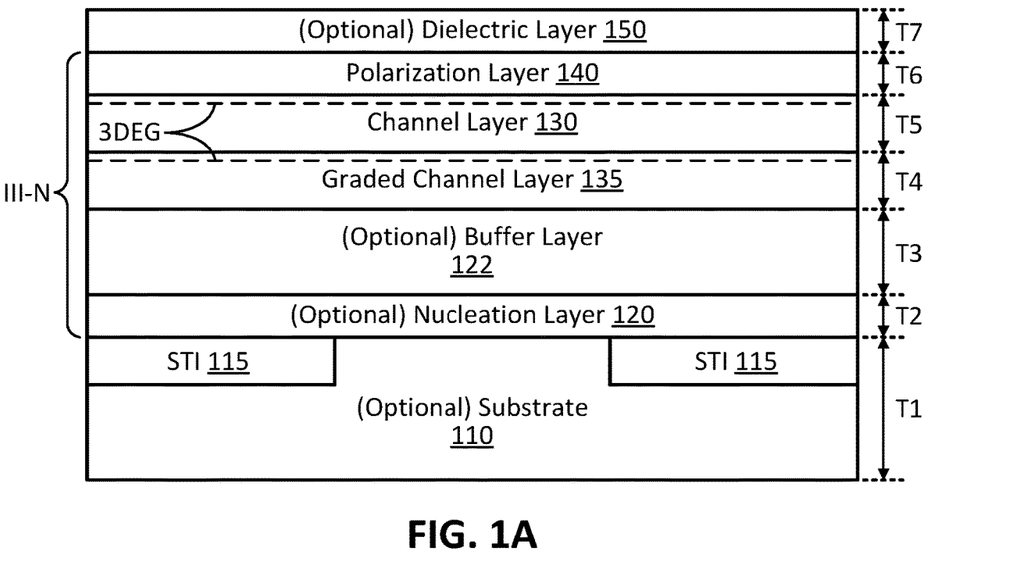
FIGS. 1A-E illustrate example integrated circuit structures used to form a tunable capacitor device including a three-dimensional electron gas (3DEG) structure, in accordance with some embodiments of this disclosure. Note that FIG. 1E is a cross-sectional view of the structure of FIG. 1D along the plane E-E. The example structure of FIG. 1E is provided to illustrate that the 3DEG tunable capacitor device may have a non-planar configuration, in some embodiments.
Figure 1B:
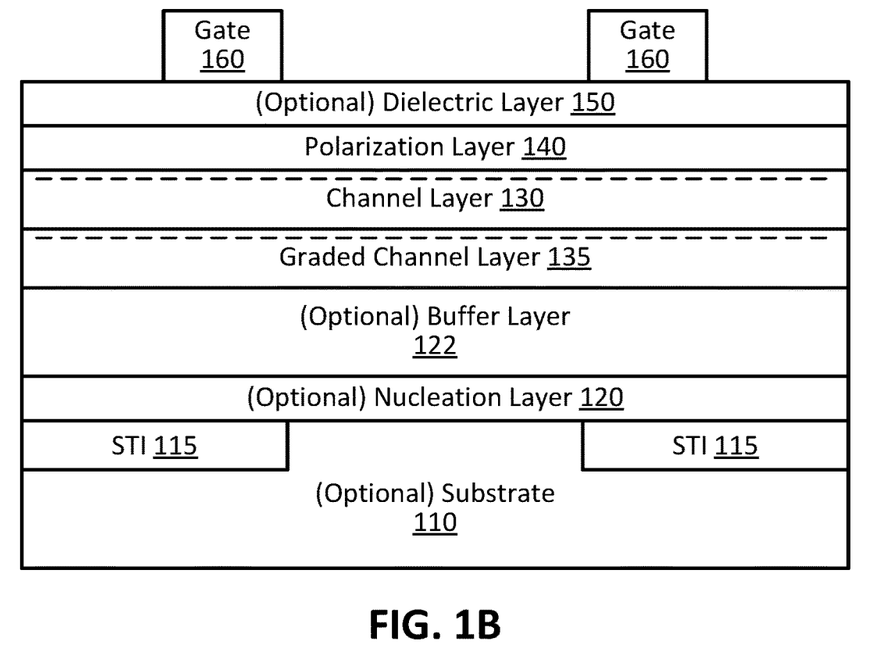
Figure 1C:
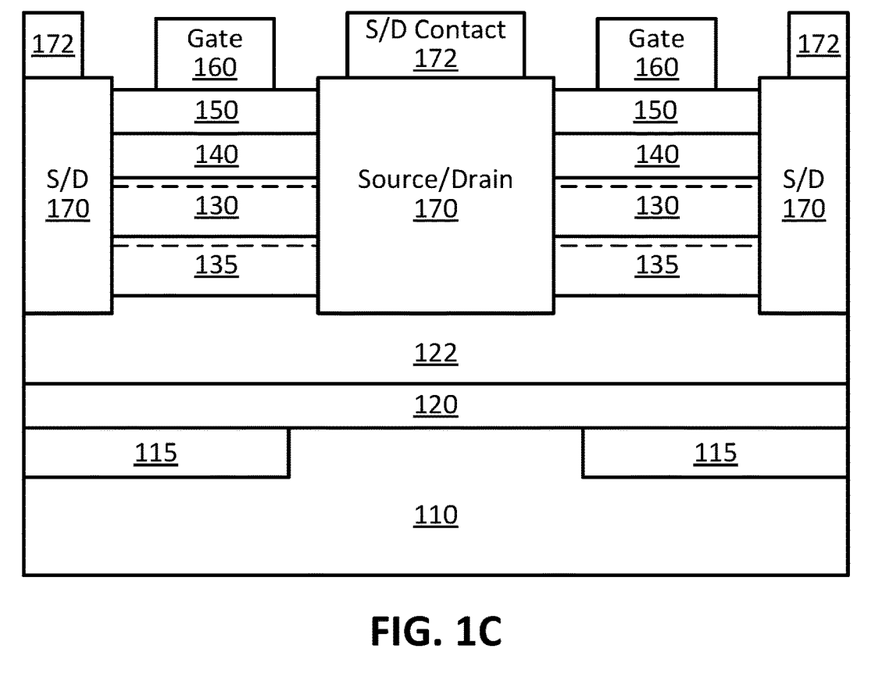
Figure 1D:
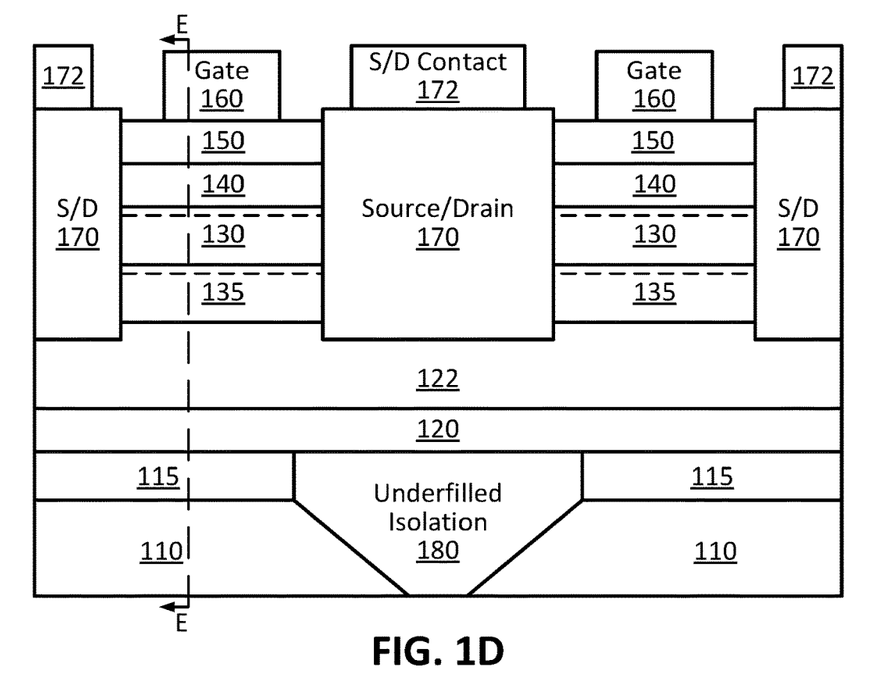
Figure 2A:
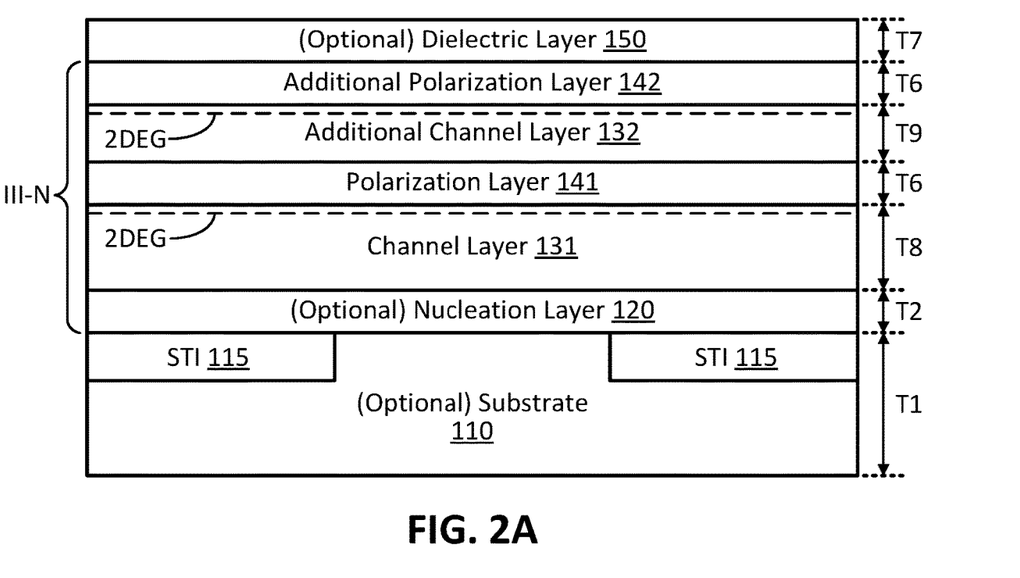
FIGS. 2A-E illustrate example integrated circuit structures used to form a tunable capacitor device including a multiple two-dimensional electron gas (2DEG) structure, in accordance with some embodiments of this disclosure. Note that FIG. 2E is a cross-sectional view of the structure of FIG. 1E along the plane E-E. The example structure of FIG. 2E is provided to illustrate that the multi-2DEG tunable capacitor device may have a non-planar configuration, in some embodiments.

FIGS. 1A and 2A illustrate example stacks of layers that may be used to form tunable capacitor devices including a 3DEG and multi-2DEG structure, respectively. The layers in the stacks shown in FIGS. 1A and 2A may be formed using any suitable techniques, such as one or more deposition or growth processes. For example, in some embodiments, formation of one or more of the layers may be performed using metal-organic chemical vapor deposition (MOCVD), molecular-beam epitaxy (MBE), chemical vapor deposition (CVD), atomic layer deposition (ALD), physical vapor deposition (PVD), or any other suitable process as will be apparent in light of this disclosure. As can be seen in FIGS. 1A and 2A, the initial stack of layers have some similarities and some differences to achieve the different 3DEG and multi-2DEG structures. However, the process of forming the tunable capacitor devices from the initial stack of layers in FIGS. 1A and 2A is similar. Therefore, there will be overlap in the formation process between FIGS. 1B-D and FIGS. 2B-D, respectively, where FIGS. 1B-D relate to forming a device including a 3DEG structure and FIGS. 2B-D relate to forming a device including multi-2DEG structures. Note that in some embodiments, a tunable capacitor device may include at least one 3DEG structure and at least one 2DEG structure. In some embodiments, a tunable capacitor device may include a structure having any of the following configurations: single 2DEG; multi-2DEG; single 3DEG; multi-3DEG; at least one 2DEG and at least one 3DEG; or any other suitable configuration, depending on the end use or target application.

In the example embodiments of FIGS. 1A and 2A, a vertical stack of III-N material layers is included in each of the structures shown. In the example embodiment of FIG. 1A, which includes a 3DEG configuration, the stack of III-N material layers includes, from bottom to top, optional nucleation layer 120, optional buffer layer 122, graded channel layer 135, channel layer 130, and polarization layer 140, each of which will be described in more detail herein. In the example embodiment of FIG. 2A, which includes a multi-2DEG configuration, the stack of III-N material layers includes, from bottom to top, optional nucleation layer 120, channel layer 131, polarization layer 141, additional channel layer 132, and additional polarization layer 142, each of which will be described in more detail herein. Recall that III-N materials are group III element-nitride (III-N) compounds/materials, which may include a compound of one or more group III materials (e.g., aluminum, gallium, and/or indium), with nitrogen, thereby including, but not limited to GaN, InN, AlN, AlInN, AlGaN, InGaN, and AlInGaN. As can also be seen in the example structures of FIGS. 1A and 2A, an optional substrate 110 including shallow trench isolation (STI) 115 structures and an optional dielectric layer 150 are shown in the stack of materials, each of which will be described in more detail herein. Substrate 110 is optional, because in some embodiments, the III-N material stack may be formed on a bulk III-N wafer, where buffer layer 122 or channel layer 131 may be the bulk III-N wafer, for example. Dielectric layer 150 is optional, because in some embodiments, dielectric layer 150 need not be present to form a tunable capacitor, such as in embodiments where the tunable capacitor is a Schottky diode, for example.

In some embodiments, optional substrate 110 may be a bulk substrate of one or more group IV materials/compounds, such as a bulk Si, Ge, SiC, or SiGe substrate, or substrate 110 may be a sapphire substrate, or substrate 110 may include any other suitable material, depending on the end use or target application. In some embodiments, substrate 110 may be an X on insulator (XOI) structure where X comprises Si, Ge, SiC, SiGe, or sapphire, and the insulator material is an oxide material or dielectric material or some other electrically insulating material. In some embodiments, substrate 110 may include a III-V compound/material, which includes at least one group III element (e.g., aluminum, gallium, indium, boron, thallium) and at least one group V element (e.g., nitrogen, phosphorus, arsenic, antimony, bismuth). Although substrate 110 is illustrated in FIGS. 1A and 2A as having a similar thickness as the other layers in the structure, in some instances, substrate 110 may be much thicker than the other layers, such as on the order of at least 10, 100, or 1000 times thicker. For example, where substrate 110 is a bulk substrate, it may have a thickness T1 in the range of 50 to 950 microns. In some embodiments, substrate 110 (or the base III-N material layer, where a bulk III-N wafer is used and substrate 110 is not present) may be used for one or more other integrated circuit (IC) devices, such as various diodes (e.g., light-emitting diodes (LEDs) or laser diodes), various transistors (e.g., metal-oxide-semiconductor field-effect transistors (MOSFETs) or tunnel FETs (TFETs)), various microelectromechanical systems (MEMS), various nanoelectromechanical systems (NEMS), various sensors, or any other suitable semiconductor or IC devices, depending on the end use or target application. Accordingly, in some embodiments, the III-N tunable capacitor devices variously described herein may be included in different system-on-chip (SoC) applications, depending on the end use or target application.

In some embodiments, such as embodiments including optional substrate 110, shallow trench isolation (STI) processing may be performed to form STI regions 115. In some such embodiments, the STI processing may include patterning and etching substrate 110 to form STI trenches, depositing the STI 115 material, and possibly planarizing the structure. STI 115 processing may be performed to reduce or prevent electric current leakage between adjacent semiconductor device components, for example. In some embodiments, the STI 115 material may be one or more dielectric, oxide, or nitride materials, such as silicon dioxide or silicon nitride, or any other suitable material depending on the end use or target application. As can be understood based on this disclosure, in embodiments where optional substrate 110 is not present, STI 115 processing need not be performed. As can also be understood based on this disclosure, even in embodiments where optional substrate 110 is present, STI 115 processing need not be performed.

In some embodiments, particularly where the bottom III-N layer of the III-N vertical stack (e.g., buffer layer 122 in FIG. 1A or channel layer 131 in FIG. 1B) is formed on a non-III-N material substrate (e.g., on a Si, Ge, SiGe, SiC, or sapphire optional substrate 110), optional nucleation layer 120 may be formed between the III-N material layers used for the 2DEG and/or 3DEG structures and substrate 110 to, for example, improve growth conditions and/or prevent the subsequently deposited III-N material layers from reacting with the substrate material. In some embodiments, nucleation layer 120, where present, may include a III-N material, such as AlN or a low temperature GaN layer (e.g., epitaxially grown at a temperature in the range of 700 to 950 degrees Celsius), for example. In some embodiments, nucleation layer 120, where present, may have a multilayer structure including multiple III-N materials, which may or may not include grading (e.g., increasing and/or decreasing content) of one or more materials throughout the multilayer structure. Further, in some embodiments, nucleation layer 120, where present, may have any suitable thickness, such as a thickness T2 of 1 nm to 2 microns (e.g., 10 nm to 1 micron), or any other suitable thickness depending on the end use or target application.

In the example structure of FIG. 1A, optional buffer layer 122 may be included in the stack of layers to, for example, improve growth conditions and/or prevent subsequently deposited III-N material layers from reacting with underlying materials, in a similar manner to optional nucleation layer 120. In some embodiments, buffer layer 122, where present, may include a III-N material, such as AlN or a low temperature GaN layer (e.g., epitaxially grown at a temperature in the range of 700 to 950 degrees Celsius), for example. In some embodiments, buffer layer 122, where present, may have a multilayer structure including multiple III-N materials, which may or may not include grading (e.g., increasing and/or decreasing content) of one or more materials throughout the multilayer structure. Further, in some embodiments, buffer layer 122, where present, may have any suitable thickness, such as a thickness T3 of 500 nm to 3 microns (e.g., 1 to 2 microns), or any other suitable thickness depending on the end use or target application. Note that although optional buffer layer 122 is not shown in the example structure of FIG. 2A, it may be present in some embodiments.

In the example structures of FIGS. 1A and 2A, the channel layers are indicated by numbers in the 130s and the polarization layers are indicated by numbers in the 140s. In some embodiments, the channel layers and polarization layers of the example structures may be collectively referred to herein as a vertical stack of III-N layers, as the channel and polarization layers of each structure include III-N materials. Note that in some such embodiments, one or more layers in the vertical stack of III-N layers may include other materials, such as in the case where one or more of the layers are doped with another material. For example, in some such embodiments, one or more of the layers in the vertical stack of III-N materials may include silicon and/or selenium for an n-type doping scheme, for example, or beryllium and/or carbon for a p-type doping scheme. As previously described, the structures may use polarization doping, which can be achieved using polarization layers 140-142 to form electron gas configurations as variously shown in FIGS. 1A and 2A. As can be seen in FIGS. 1A and 2A, the vertical stack of III-N layers in each of the example structures includes a channel layer and a polarization layer, specifically, channel layer 130 and polarization layer 140 in the example structure of FIG. 1A and channel layer 131 and polarization layer 141 in the example structure of FIG. 2A. The differences between the structures in these example embodiments is that the vertical stack of III-N layers FIG. 1A includes a graded channel layer 135 below channel layer 130 to form a 3DEG configuration (indicated with dashed lines), whereas the structure of FIG. 2A includes an additional channel layer 132 and polarization layer 142 to form a multi-2DEG configuration (indicated with dashed lines). Note that although the multi-2DEG structure of FIG. 2A only includes two 2DEGs, the techniques may be used to form a multi-2DEG structure including 3, 4, 5, 6, 7, 8, 9, 10, or any number of suitable 2DEGs. In some such embodiments including greater than two 2DEGs, the structure may include further additional channel and polarization layer sets (e.g., in addition to additional channel/polarization layer set 132/142) in the vertical stack of III-N layers, for example.

In some embodiments, channel layers 130-132 and graded channel layer 135 may include any suitable materials, such as one or more III-N materials. In some such embodiments, one or more of channel layers 130-132 may include gallium, such as material layers of GaN or InGaN, for example. In some embodiments, graded channel layer 135 may include grading the content of one or more materials throughout the layer 135 in an increasing and/or decreasing manner. As can be seen in the example structure of FIG. 1A, channel layer 130 is formed above and on graded channel layer 135, in this embodiment. In some embodiments, graded channel layer 135 may include $In_xGa_{1-x}N$, where x is the content of indium in the layer and that indium content is graded from 0-20% (x=0-0.2) at or near the bottom of graded channel layer 135 (with the bottom being closest to optional buffer layer 122 in the example structure FIG. 1A) to 15-50% (x=0.15-0.5) at or near the top of the layer 135 (with the top being closes to channel layer 130 in the example structure of FIG. 1A). For example, in an embodiment, graded channel layer 135 may include $In_xGa_{1-x}N$, where the indium content ranges from 0% (x=0) at or near the bottom of graded channel layer 135 to approximately 30% (x=0.3) at or near the top of the layer 135. In another example embodiment, graded channel layer 135 may include $In_xGa_{1-x}N$, where the indium content ranges from 0% (x=0) at or near the bottom of graded channel layer 135 to approximately 10% (x=0.1) at or near the center of layer 135 back down to 0% (x=0) at or near the top of the layer 135. Note that approximately as used with the percentage of indium content in the layers may indicate a difference of plus/minus at most 1, 2, 3, or 5%, in some embodiments.

In some embodiments, channel layers 130-132 and graded channel layer 135 may have any suitable thicknesses T5, T8, T9, and T4, respectively, such as between 2 nm and 2 microns, or any other suitable thickness depending on the end use or target application. In some embodiments, graded channel layer 135 may have a thickness T4 that is approximately 1.5, 2, 3, 4, or 5 times the thickness T5 of channel layer 130. For example, in such an embodiment, graded channel layer 135 may have a thickness T4 of approximately 10 nm and channel layer 130 may have a thickness T5 of approximately 5 nm. In embodiments where substrate 110 is not present, and channel layer 131 is a bulk wafer, for example, then channel layer 131 may be substantially thicker, such as having a thickness T8 of greater than 50 microns, for example. In some embodiments, channel layer 131 may have a greater thickness T8 than the thickness T9 of additional channel layer 132 (or any subsequently deposited additional channel layers, where included in a multi-2DEG structure including three or more 2DEG configurations), as channel layer 131 is the bottom-most channel layer in the structure, for example.

As can be seen in the example structures of FIGS. 1A and 2A, a respective polarization layer 140-142 is formed on each channel layer 130-132. In some embodiments, polarization layers 140-142 may include any suitable materials, such as one or more III-N materials. In some embodiments, one or more of polarization layers 140-142 may include aluminum (Al), such that the layer includes AlN, AlInN, AlGaN, and/or AlInGaN, for example. In some embodiments, one or more of polarization layers 140-142 may have a multilayer structure including multiple III-N materials, which may or may not include grading (e.g., increasing and/or decreasing content) of one or more materials throughout the multilayer structure. In some such embodiments, one or more of polarization layers 140-142 may include two III-N layers, with the bottom layer used to enhance carrier mobility and the top layer used to improve the compatibility (e.g., density of interface traps) with layers subsequently grown/deposited thereon (e.g., optional dielectric layer 150, where present). For example, in some such embodiments, one or more of polarization layers 140-142 may be a multilayer structure including a bottom layer (closest to the underlying respective channel layer 130-132) of AlN and a top layer (closes to the overlying layer) of AlInN. In some embodiments, polarization layers 140-142 may have a thickness T6 of 0.5 to 50 nm (e.g., 1 to 20 nm), or any other suitable thickness, depending on the end use or target application. Note that in some embodiments, a passivation layer (not shown), such as a GaN layer, may be deposited on one or more of polarization layers 140-142 to, for example, protect the vertical stack of III-N materials or improve surface conditions for subsequently deposited materials. In some such embodiments, the passivation layer may be thin, such as 0.5 to 10 nm (e.g., approximately 2 nm), or any other suitable thickness, depending on the end use or target application.

In some embodiments, optional dielectric layer 150 may be formed on the vertical stack of III-N layers, such as on polarization layer 140 in the example structure of FIG. 1A or on additional polarization layer 142 in the example structure of FIG. 1B, for example. In some embodiments, dielectric layer 150 will be used as a gate dielectric layer, which may result in improvements on gate leakage, such as improvements of at least 100 or 1000 times reduction in gate leakage, for example, as compared to a structure lacking the gate dielectric layer. For example, in embodiments where dielectric layer 150 is present, the structure formed may be a metal-oxide-semiconductor capacitor (MOSCAP) device, as will be apparent in light of this disclosure. However, in some embodiments, dielectric layer 150 need not be present, such as in the case of a Schottky diode. In some embodiments, dielectric layer 150 may include any suitable materials, such as silicon dioxide or a high-k dielectric material, for example. High-k dielectric materials may include materials having a dielectric constant, k, greater than that of silicon dioxide (e.g., a k value greater than approximately 3.9), such as hafnium oxide (or hafnia), hafnium silicate, lanthanum oxide, lanthanum aluminum oxide, zirconium oxide, zirconium silicate, tantalum oxide, tantalum silicate, titanium oxide, barium strontium titanium oxide, barium titanium oxide, strontium titanium oxide, yttrium oxide, aluminum oxide, aluminum silicate, lead scandium tantalum oxide, and lead zinc niobate, to name some examples. In some embodiments, dielectric layer 150 may be a multi-layer structure including at least two layers of dielectric materials. In some embodiments, dielectric layer 150, where present, may have a thickness T7 of 0.5 to 50 nm (e.g., 2-10 nm), or any other suitable thickness, depending on the end use or target application.

Figure 2B:
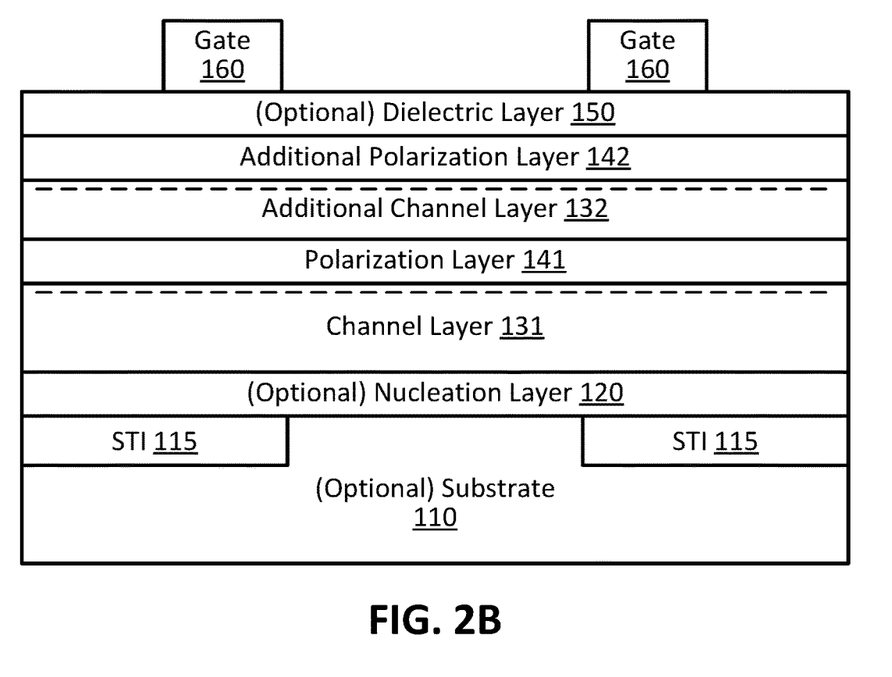

FIGS. 1B and 2B illustrate example resulting structures after formation of gates 160 on the structures of FIGS. 1A and 2A, respectively, in accordance with some embodiments. In some embodiments, gates 160 may be formed using any suitable techniques, such as depositing the gate material and patterning the gates to the structures shown, for example. In some embodiments, the gate may include polysilicon (polycrystalline silicon) or any suitable metal material, such as titanium nitride (TiN), nickel (Ni), gold (Au), copper (Cu), or other suitable soft metals, for example. In some embodiments, one or more of gates 160 may be electrically connected to other structures using interconnects, for example. As previously described, where present, dielectric layer 150 may be used as a gate dielectric layer for gates 160 in some embodiments, such as in a MOSCAP device configuration. However, in some embodiments, dielectric layer 150 may not be present, and in such embodiments, gates 160 may be formed directly on the upper polarization layers 140 or 142 (or on a passivating layer, such as a thin GaN layer, where present), such as in a Schottky diode device configuration. In some embodiments, the gate and/or gate dielectric, where present, may include a multi-layer structure that has two or more material layers, which may or may not include grading (e.g., increasing and/or decreasing) the content of one or more materials throughout the multi-layer structure. For instance, in some embodiments, gate 160 may include at least one interfacial layer (e.g., at least one workfunction material layer) to improve interface quality and/or electric properties between the gate dielectric 150 and gate 160 materials, for example. Note that in some embodiments, side-wall spacers, or generally, spacers (not shown), may be formed on either side of the gate 160 (and optionally, gate dielectric 150, where present) to help electrically isolate the gate stack from source/drain regions 170, for example.

Figure 2C:
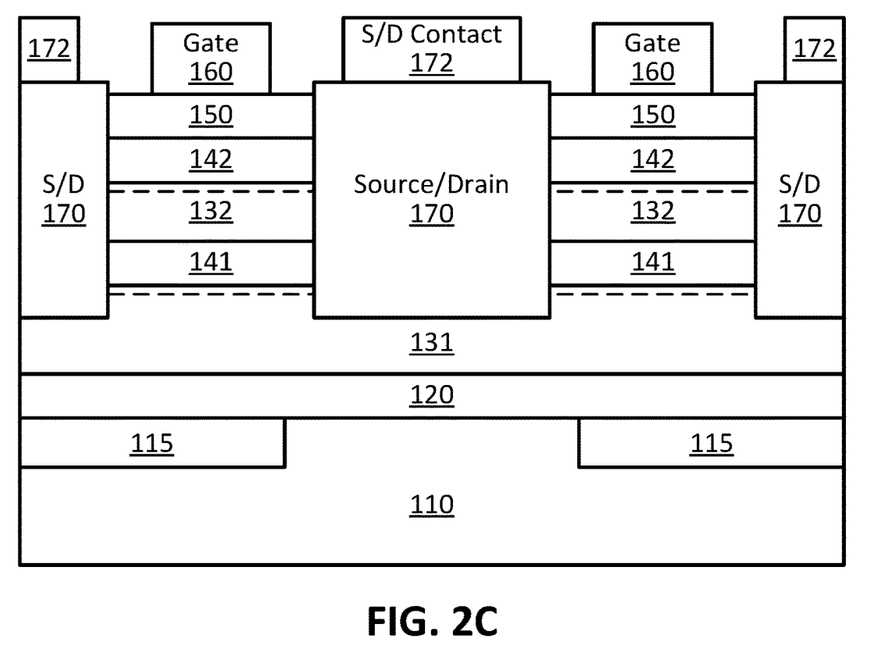

FIGS. 1C and 2C illustrate example resulting structures after formation of source and drain (S/D) regions 170 and S/D contacts 172 in the structures of FIGS. 1B and 2B, respectively, in accordance with some embodiments. Formation of S/D regions 170 and contacts 172 may be performed using any suitable techniques, such as by etching out S/D trenches, regrowing (e.g., via epitaxial deposition) the S/D material to form S/D regions 170 as shown, and then metallizing the S/D regions to form contacts 172, for example. In some embodiments, S/D regions 170 may include any suitable materials, such as one or more III-N materials, or any other suitable material depending on the end use or target application. In addition, in some embodiments, S/D regions 170 may be doped in an n-type or p-type manner, for example, using any suitable doping techniques. In an example embodiment, S/D regions may be formed with InN or InGaN doped in an n-type manner using Si with high doping amounts (e.g., of approximately 2E20 per cubic cm). As can be seen in FIGS. 1C and 2C, the S/D regions extend down into the stack of III-N materials, such that the lower portion of the S/D regions is below all 2DEG and 3DEG configurations (e.g., as indicated in dashed lines in FIGS. 1A and 2A). For example, if the multi-2DEG structure of FIG. 2C included a third set of channel and polarization layers, then the S/D regions 170 may be formed to be adjacent to and contact all three sets of layers. In some embodiments, the S/D contacts 172 may include titanium (Ti), platinum (Pt), aluminum (Al), or other suitable metals, for example.

Figure 2D:
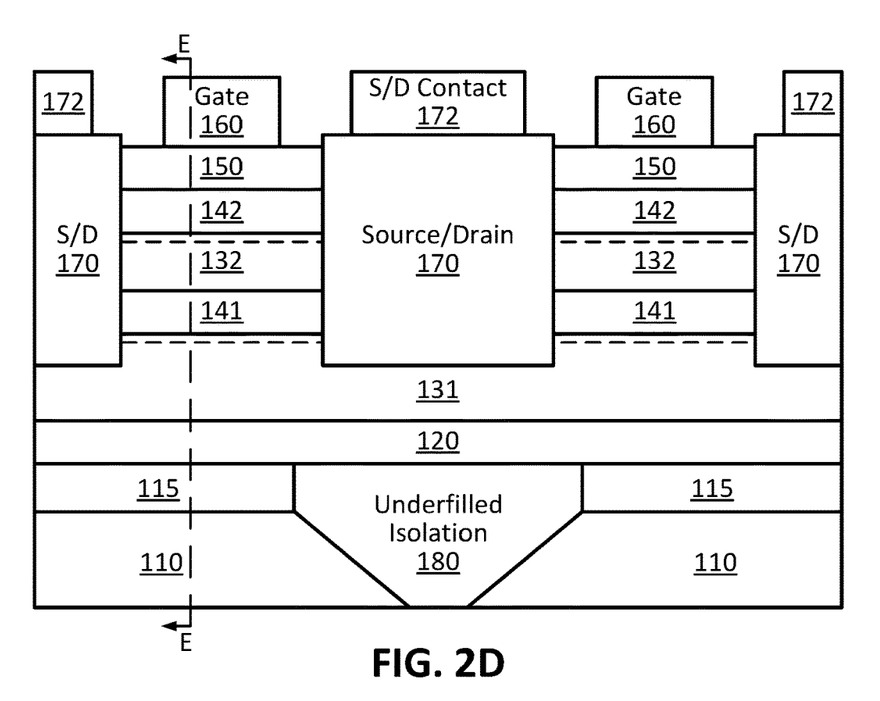

FIGS. 1D and 2D illustrate example resulting structures after forming underfilled isolation regions 180 in the structures of FIGS. 1C and 2D, respectively, in accordance with some embodiments. Formation of underfilled isolation regions 180 may be performed using any suitable techniques, such as etching away substrate 110 material where STI 115 material is not located, such as under the center S/D regions 170 in the example structures of FIGS. 1C and 2C.

Such an etching process may include, for example, a dry etch behind or in front of the cross-sectional location of the structures shown to reach the level of substrate 110 and then flowing in wet etchant to selectively remove the substrate 110 material and undercut the structure to form a cavity having a similar shape as the underfilled isolation regions 180 shown in FIGS. 1D and 2D. The cavities can then be filled with an isolation material, such as a dielectric, oxide, or nitride material, such as silicon dioxide or silicon nitride, for example. Underfilled isolation regions 180 may be included in the example structures of these embodiments to, for example, help with electrical isolation of the tunable capacitor devices from the underlying substrate 110. Note that in some embodiments, underfilled isolation regions 180 need not be formed, such as when substrate 110 is not present and the vertical stack of III-N layers is formed on a bulk III-N wafer, for example.

Figure 1E:
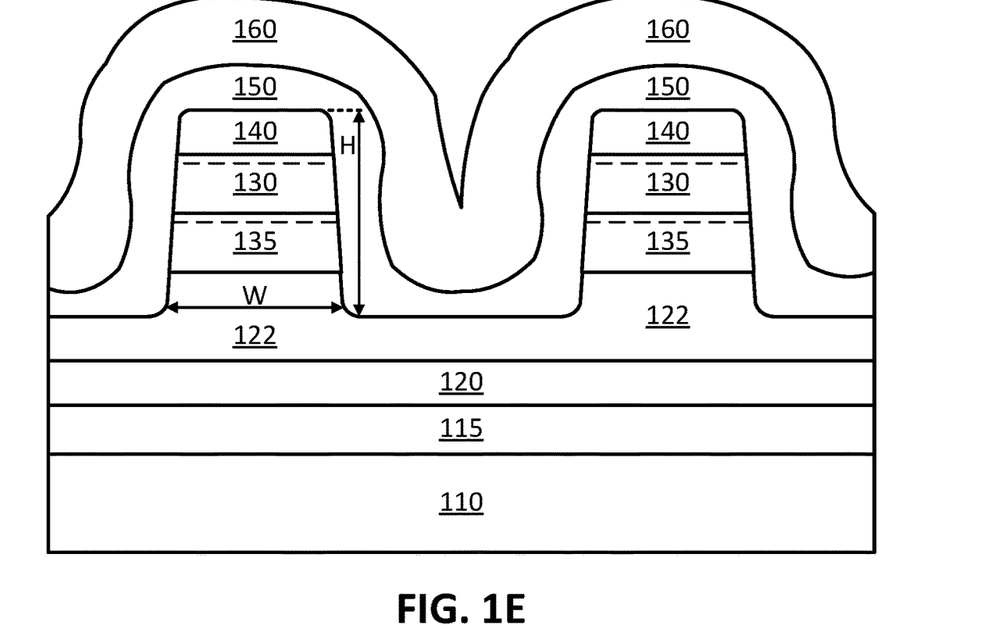
Figure 2E:
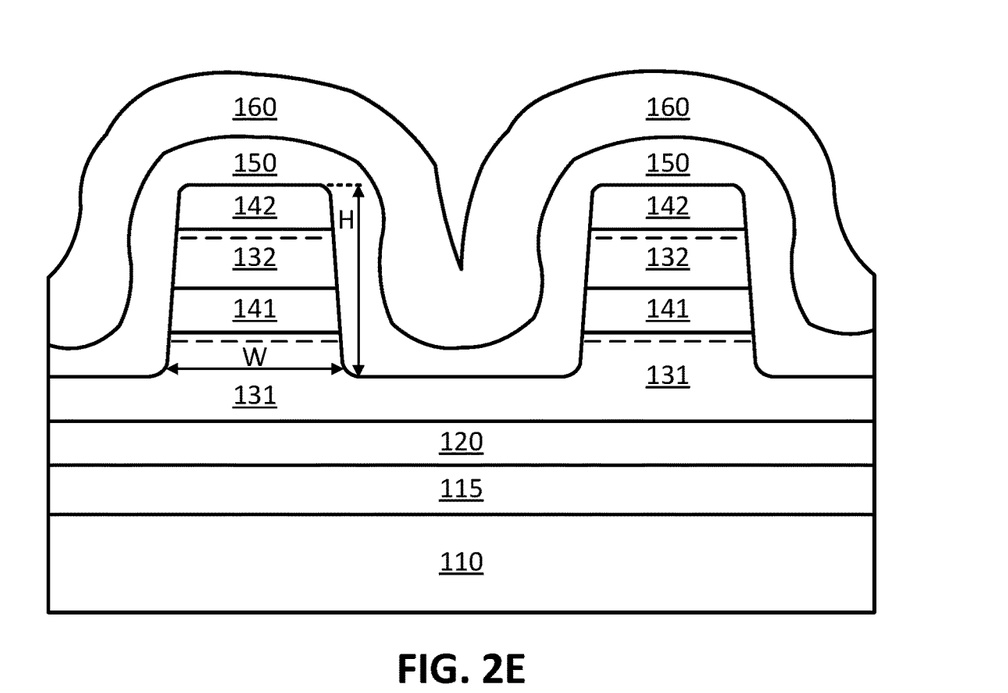

FIGS. 1E and 2E illustrate example cross-sectional views of the structure of FIGS. 1D and 2D, respectively, along the plane E-E, in accordance with some embodiments. As previously described, the structures of FIGS. 1A-D and 2A-D may have planar or non-planar configurations. For example, planar structures may include having gate 160 only above the vertical stack of III-N materials, as shown in FIGS. 1A-D and 2A-D. The example structures of FIGS. 1E and 2E are provided to illustrate non-planar configurations, and more specifically, finned configurations for the tunable capacitor devices. As shown, the vertical stack of III-N materials in each structure (layers 122/135/130/140 in FIG. 1E and layers 131/141/132/142 in FIG. 2E) are formed into two fins, with the gate 160 (and gate dielectric 150, where present) located above and adjacent to either side of the fins. Such a finned configuration is sometimes referred to as a tri-gate and/or three-dimensional (3D) configuration, as the conductive channel of such finned configurations essentially resides along the three different outer, substantially planar regions of the fin. Other types of non-planar configurations are available, such as dual-gate configurations, in which the conductive channel principally resides only along two sidewalls of the fin (and not along the top of the fin). A nanowire configuration (sometimes referred to as a gate-all-around or nanoribbon configuration) is configured similarly to a fin-based configuration, but instead of a finned channel region where the gate is on three portions (and thus, there are three effective gates), one or more nanowires are used and the gate material generally surrounds each nanowire. Such a structure may be achieved, for example, by including a sacrificial layer under the vertical stack of III-N layers and removing that sacrificial layer in the channel region (e.g., during a replacement gate process). In some embodiments, non-planar configurations (e.g., the finned configurations of FIGS. 1E and 2E) may be used to increase the area of the tunable capacitor device, and thereby increase the capacitance per unit area, for example. Further, in some such non-planar embodiments, where the gate is adjacent to additional surfaces of the vertical III-N stack (e.g., adjacent to the sidewalls of the fins in the example structures of FIGS. 1E and 2E), an increase in the effective control of the charge (e.g., 2DEG/3DEG) in the channels may be achieved, particularly as critical dimensions scale down to less than 30 nm, for example.

Continuing with the example structures of FIGS. 1E and 2E, the fins may have been formed using any suitable techniques, such as patterning and etching the stack of III-N layers to form at least one fin having width W and height H. As can be seen in FIGS. 1E and 2E, the width W and height H are the maximum width and height of the fins. Note that in these example embodiments each fin maintains a consistent height H across the width of the fin, while in some other embodiments, a single fin may have varying heights, for example. Also note that in these example embodiments, each fin has varying widths along the height of the fin (and more specifically in these example embodiments, a decreasing or tapering width going up the fin), while in some other embodiments, a single fin may have a consistent width along the height of the fin, for example. In some embodiments, the fins may be formed to have a width W of 3 to 100 nm, for example, or any other suitable width depending on the end use or target application. In some embodiments, the fins may be formed to have a height H of 5 to 100 nm, or any other suitable height depending on the end use or target application. In some embodiments, the fins may be formed with a desired approximate height H to width W ratio (H:W), such as 1.5:1, 2:1, 3:1, 4:1, 5:1, or any other suitable H:W ratio, depending on the end use or target application. In some embodiments, the desired number of 3DEG and/or 2DEG structures formed for the tunable capacitor device may affect the width W and/or height H of a particular fin. For example, multi-2DEG structures including greater numbers of 2DEG structures (e.g., greater than 2, 3, 4, 5, and so forth) may result in relatively higher fin structures. Note that although the two fins in each of the example structures of FIGS. 1E and 2E are illustrated as having the same widths W and heights H, the present disclosure is not intended to be so limited. For example, in some embodiments, fins formed on the same substrate or die may be formed to have varying widths and/or heights, depending on the end use or target application. Also note that although two fins are illustrated in each of the example structures of FIGS. 1E and 2E, any number of fins may be formed during the integrated circuit fabrication process, such as 1, 3, 5, 10, 100, thousands, or more, depending on the end use or target application.

Figure 3A:
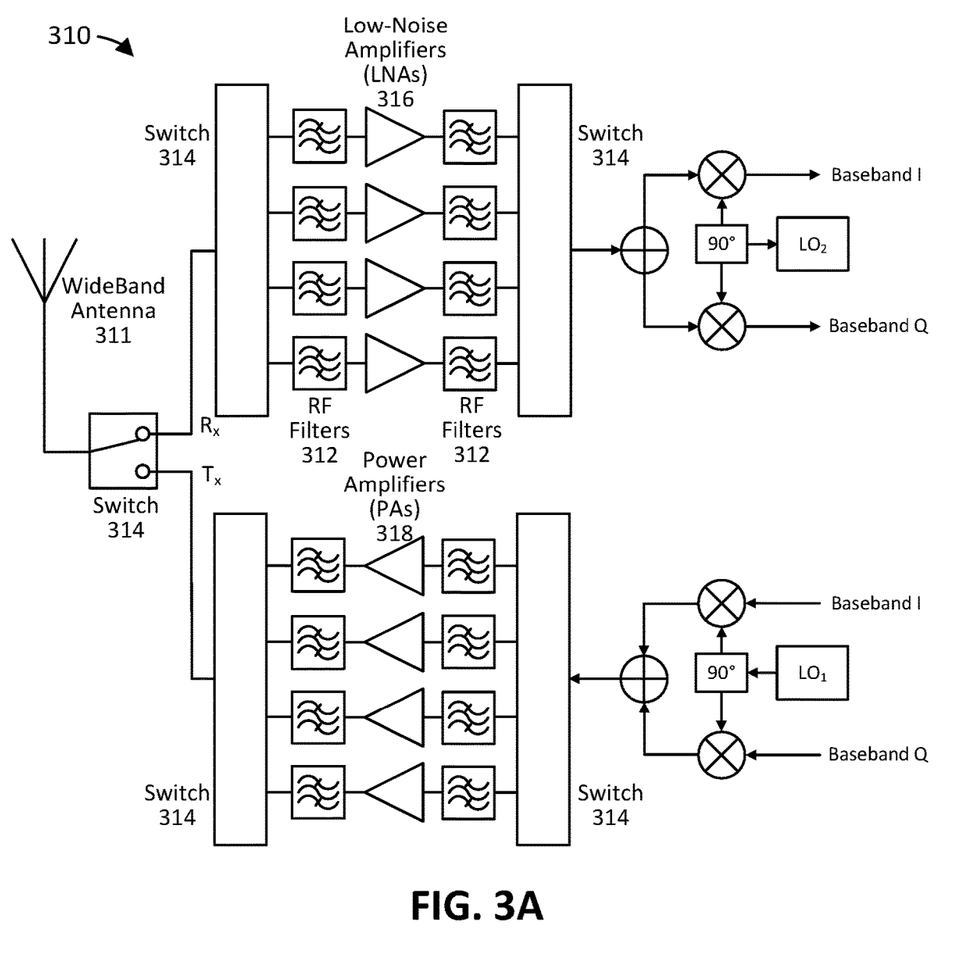
FIG. 3A illustrates an example RF front end architecture including sixteen non-tunable RF filters.
Figure 3B:
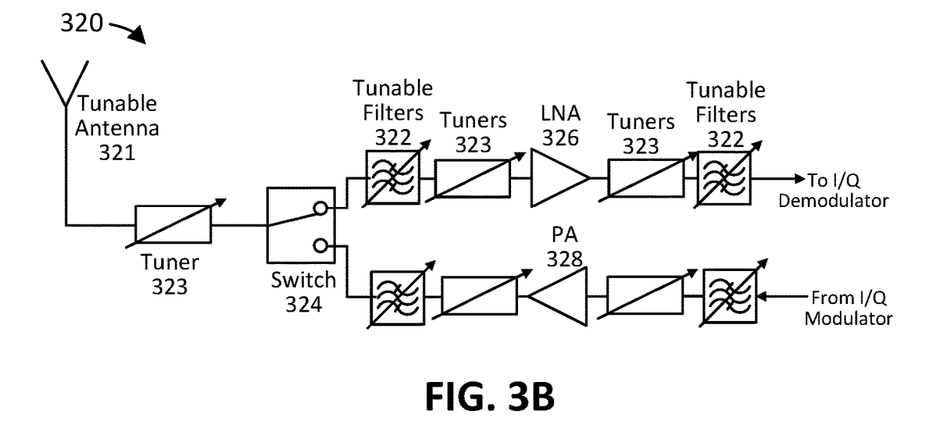
FIG. 3B illustrates an example RF front end architecture including tunable RF filters employing the tunable capacitor devices variously described herein to significantly reduce the number of RF filters in the architecture of FIG. 3A down to four filters (from sixteen).

FIGS. 3A-B illustrate example RF front end architectures, in accordance with some embodiments of this disclosure. More specifically, FIG. 3A illustrates an example RF front end architecture 310 including numerous non-tunable RF filters 312 typically found in RF front end, which in this specific architecture includes sixteen RF filters. As can also be seen, architecture 310 includes wideband antenna 311, switches 314, low-noise amplifiers (LNAs) 316, and power amplifiers (PAs) 318, as well as other suitable componentry used for a RF front end architecture. FIG. 3B illustrates an example RF front end architecture 320 including tunable RF filters 322 employing the tunable capacitor devices variously described herein and having similar or improved capabilities relative to the RF front end architecture 310 of FIG. 3A. As can be seen, the sixteen non-tunable RF filters 312 in the example architecture 310 of FIG. 3A have been replaced with four tunable RF filters 322 in the example architecture 320 of FIG. 3B. Therefore, in this example case, the tunable RF filters 322 are each able to achieve at least 4 distinct capacitance levels using the multi-2DEG and/or 3DEG tunable capacitor structures variously described herein. As can also be seen, the four LNAs 316 and PAs 318 have been replaced by a single LNA 326 and PA 318, and four switches 314 were also removed. Note that tuners 323 are included in example architecture 320 and thus, architecture 320 includes a tunable antenna 321. The significant reduction in the number of RF filters used in the different example architectures (e.g., 16 non-tunable RF filters in architecture 310 and 4 tunable RF filters in architecture 320), as well as the reduction in other RF front end componentry (e.g., amplifiers and switches) may result in a smaller footprint (e.g., at least a 5, 10, 15, 25, 50, 75, or 85% reduction in IC area)

and/or a reduction in bill of materials (BOM) cost (e.g., at least a 5, 10, 15, 25, 50, 75 or 85% reduction in BOM cost). Further, the use of tunable RF filters as variously described herein can enable small form-factors for mobile devices, such as mobile/smart phones, tablet computers, wearable computing devices (e.g., smart watch or smart glasses), and other mobile computing devices. Numerous variations and configurations will be apparent in light of the preset disclosure.

Example System

Figure 4:
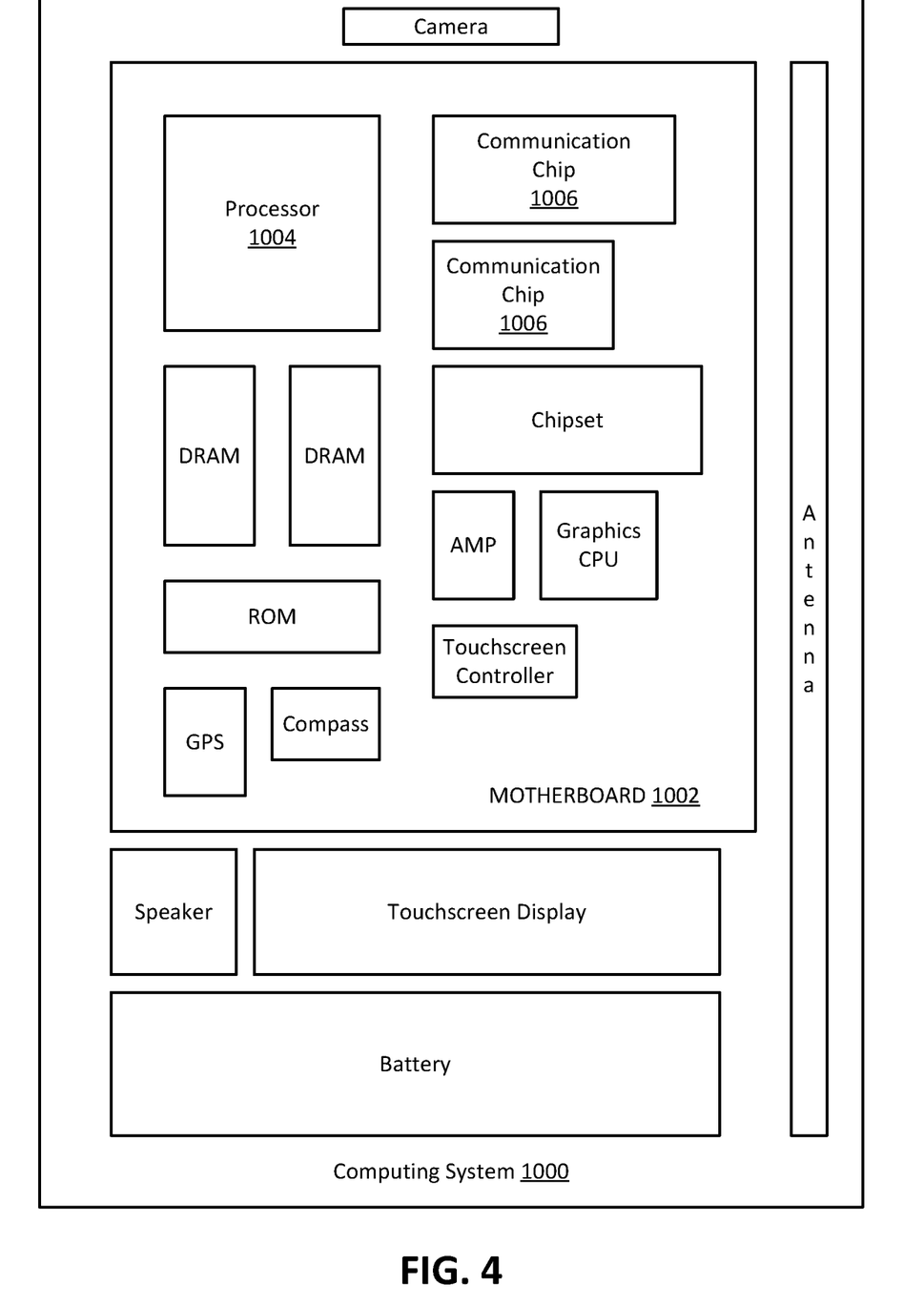
FIG. 4 illustrates a computing system implemented with integrated circuit structures or devices formed using the techniques disclosed herein, in accordance with some embodiments.

FIG. 4 illustrates a computing system 1000 implemented with integrated circuit structures or devices formed using the techniques disclosed herein, in accordance with some embodiments. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more tunable capacitor devices as variously described herein (e.g., including a multi-2DEG and/or 3DEG structure) and such tunable capacitor devices may be included in one or more tunable RF filters. In some cases, the use of such tunable RF filters may reduce the physical footprint occupied by RF filters in the RF front end and/or reduce the bill of materials cost, for example.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is a tunable capacitor device including: a vertical stack of layers, each layer of the stack including a group III material-nitride (III-N) compound, wherein the vertical stack of layers includes: a channel layer; a polarization layer on the channel layer; and at least one of: a graded layer below the channel layer, wherein the graded layer includes vertical compositional grading of at least one material; and an additional channel layer and an additional polarization layer on the additional channel layer, wherein the additional channel and polarization layers are above the polarization layer; and a gate above the vertical stack of layers.

Example 2 includes the subject matter of Example 1, wherein the channel layer includes gallium (Ga).

Example 3 includes the subject matter of any of Examples 1-2, wherein the polarization layer includes aluminum (Al).

Example 4 includes the subject matter of any of Examples 1-3, wherein the gate is a metal gate.

Example 5 includes the subject matter of any of Examples 1-4, wherein the vertical stack of layers includes the graded layer below the channel layer.

Example 6 includes the subject matter of Example 5, wherein the graded layer includes compositional grading of indium (In) content.

Example 7 includes the subject matter of any of Examples 5-6, wherein the graded layer and the channel layer include a three-dimensional electron gas (3DEG) configuration.

Example 8 includes the subject matter of any of Examples 1-7, wherein the vertical stack of layers includes the additional channel and polarization layers.

Example 9 includes the subject matter of Example 8, wherein each channel layer includes a two-dimensional electron gas (2DEG) configuration.

Example 10 includes the subject matter of any of Examples 1-9, further including source and drain regions adjacent to the vertical stack of layers.

Example 11 includes the subject matter of Example 10, wherein the source and drain regions are n-type doped.

Example 12 includes the subject matter of any of Examples 1-11, wherein the device has a non-planar configuration.

Example 13 includes the subject matter of any of Examples 1-12, wherein the vertical stack of layers has a finned configuration and wherein the gate is adjacent to either side of the vertical stack of layers.

Example 14 includes the subject matter of any of Examples 1-13, wherein the device is a Schottky diode.

Example 15 includes the subject matter of any of Examples 1-13, further including a gate dielectric between the gate and the vertical stack of layers.

Example 16 includes the subject matter of Example 15, wherein the device is a metal-oxide-semiconductor capacitor (MOSCAP).

Example 17 includes the subject matter of any of Examples 1-16, wherein the device is configured to achieve at least three distinct capacitance values.

Example 18 is a tunable radio frequency (RF) filter device including the subject matter of any of Examples 1-17.

Example 19 is a computing system including the subject matter of any of Examples 1-18.

Example 20 is a tunable capacitor device including: a vertical stack of group III material-nitride (III-N) compound layers, the stack including: a channel layer, wherein the channel layer includes gallium (Ga); a polarization layer on the channel layer, wherein the polarization layer includes aluminum (Al); and at least one of: an indium gallium nitride (InGaN) graded layer below the channel layer, wherein the graded layer includes vertical compositional grading of indium content; and an additional channel layer and an additional polarization layer on the additional channel layer, wherein the additional channel and polarization layers are above the polarization layer; a metal gate above the vertical stack of III-N layers; and source and drain regions adjacent to the vertical stack of III-N layers.

Example 21 includes the subject matter of Example 20, wherein the vertical stack of III-N layers includes the InGaN graded layer below the channel layer.

Example 22 includes the subject matter of any of Examples 20-21, wherein the indium content in the InGaN graded layer ranges from approximately 0% to approximately 30%.

Example 23 includes the subject matter of any of Examples 20-22, wherein the graded layer and the channel layer include a three-dimensional electron gas (3DEG) configuration.

Example 24 includes the subject matter of any of Examples 20-23, wherein the vertical stack of III-N layers includes the additional channel and polarization layers.

Example 25 includes the subject matter of Example 24, wherein each channel layer includes a two-dimensional electron gas (2DEG) configuration.

Example 26 includes the subject matter of any of Examples 20-25, wherein the device has a non-planar configuration.

Example 27 includes the subject matter of any of Examples 20-26, wherein the vertical stack of III-N layers has a finned configuration and wherein the gate is adjacent to either side of the vertical stack of III-N layers.

Example 28 includes the subject matter of any of Examples 20-27, wherein the device is a Schottky diode.

Example 29 includes the subject matter of any of Examples 20-27, further including a gate dielectric between the gate and the vertical stack of III-N layers.

Example 30 includes the subject matter of Example 29, wherein the device is a metal-oxide-semiconductor capacitor (MOSCAP).

Example 31 includes the subject matter of any of Examples 20-30, wherein the device is configured to achieve at least three distinct capacitance values.

Example 32 is a tunable radio frequency (RF) filter device including the subject matter of any of Examples 20-31.

Example 33 is a computing system including the subject matter of any of Examples 20-32.

Example 34 is a method of forming a tunable capacitor device, the method including: forming a vertical stack of layers, each layer of the stack including a group III material-nitride (III-N) compound, wherein the vertical stack of layers includes: a channel layer; a polarization layer on the channel layer; and at least one of: a graded layer below the channel layer, wherein the graded layer includes vertical compositional grading of at least one material; and an additional channel layer and an additional polarization layer on the additional channel layer, wherein the additional channel and polarization layers are above the polarization layer; and forming a gate above the vertical stack of III-N layers.

Example 35 includes the subject matter of Example 34, wherein the channel layer includes gallium (Ga).

Example 36 includes the subject matter of any of Examples 34-35, wherein the polarization layer includes aluminum (Al).

Example 37 includes the subject matter of any of Examples 34-36, wherein the gate is a metal gate.

Example 38 includes the subject matter of any of Examples 34-37, wherein the vertical stack of layers includes the graded layer below the channel layer.

Example 39 includes the subject matter of Example 38, wherein the graded layer includes compositional grading of indium (In) content.

Example 40 includes the subject matter of any of Examples 38-39, wherein the graded layer and the channel layer include a three-dimensional electron gas (3DEG) configuration.

Example 41 includes the subject matter of any of Examples 34-40, wherein the vertical stack of layers includes the additional channel and polarization layers.

Example 42 includes the subject matter of Example 41, wherein each channel layer includes a two-dimensional electron gas (2DEG) configuration.

Example 43 includes the subject matter of any of Examples 34-42, further including forming source and drain regions adjacent to the vertical stack of layers.

Example 44 includes the subject matter of Example 43, wherein the source and drain regions are n-type doped.

Example 45 includes the subject matter of any of Examples 34-44, further including patterning the vertical stack of layers into at least one fin, wherein the gate is adjacent to either side of the at least one fin.

Example 46 includes the subject matter of any of Examples 34-45, wherein the device is a Schottky diode.

Example 47 includes the subject matter of any of Examples 34-45, further including forming a gate dielectric between the gate and the vertical stack of layers.

Example 48 includes the subject matter of Example 47, wherein the device is a metal-oxide-semiconductor capacitor (MOSCAP).

Example 49 includes the subject matter of any of Examples 34-48, wherein the device is configured to achieve at least three distinct capacitance values.

Example 50 includes the subject matter of any of Examples 34-49, further including forming underfilled isolation below at least a portion of the vertical stack of layers.

Example 51 includes the subject matter of any of Examples 34-50, further including forming a tunable radio frequency (RF) filter device.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
    a first layer including gallium, indium, and nitrogen, wherein the first layer has a higher concentration of indium near a top surface of the first layer than near a bottom surface of the first layer;
    a second layer above the first layer, the second layer including gallium and nitrogen;
    a third layer above the second layer, the third layer including aluminum and nitrogen;
    a fourth layer at least above the third layer, the fourth layer including one or more dielectrics;
    a structure at least above the fourth layer, the structure including one or more metals; and
    a first region and a second region, at least one of the first layer and second layer laterally between the first and second regions, wherein the first and second regions include nitrogen and at least one of indium and gallium.

2. The integrated circuit of claim 1, wherein the second layer is directly on the first layer, and the third layer is directly on the second layer.

3. The integrated circuit of claim 1, wherein the concentration of indium near the top surface of the first layer is between 15 and 50 atomic percent.

4. The integrated circuit of claim 1, wherein the concentration of indium near the bottom surface of the first layer is between 0 and 20 atomic percent, and wherein the concentration of indium near the top surface of the first layer is between 15 and 50 atomic percent.

5. The integrated circuit of claim 1, wherein the third layer has a bilayer structure of a first distinct layer including aluminum and nitrogen, and a second distinct layer including aluminum, indium, and nitrogen.

6. The integrated circuit of claim 1, wherein the third layer is laterally between the first and second regions, wherein the first and second regions include nitrogen and both indium and gallium.

7. The integrated circuit of claim 1, wherein a vertical thickness of the first layer is at least double a vertical thickness of the second layer.

8. The integrated circuit of claim 1, further comprising a radio frequency (RF) filter device capable of achieving multiple distinct capacitance values as a result of a three-dimensional electron gas (3DEG) configuration in the first and second layers.

9. A computing system including the integrated circuit of claim 1.

10. An integrated circuit comprising:
    a first layer including gallium and nitrogen;
    a second layer above the first layer, the second layer including aluminum and nitrogen;
    a third layer above the second layer, the third layer including gallium and nitrogen;
    a fourth layer above the second layer, the fourth layer including aluminum and nitrogen;
    a structure at least above the fourth layer, the structure including one or more metals; and
    a first region and a second region, wherein the second layer is laterally between the first and second regions, and wherein the first and second regions include nitrogen and at least one of indium and gallium.

11. The integrated circuit of claim 10, wherein the second layer is directly on the first layer, the third layer is directly on the second layer, and the fourth layer is directly on the third layer.

12. The integrated circuit of claim 10, further comprising:
    a fifth layer above the fourth layer, the fifth layer including gallium and nitrogen; and
    a sixth layer above the fifth layer, the sixth layer including aluminum and nitrogen.

13. The integrated circuit of claim 10, wherein the third and fourth layers are laterally between the first and second regions, wherein the first and second regions include nitrogen and both indium and gallium, and wherein the second and fourth layers further include indium or gallium, or both indium and gallium.

14. The integrated circuit of claim 10, further comprising a fifth layer between the fourth layer and the structure, the fifth layer including one or more dielectrics wherein the second, third, and fourth layers are between portions of the structure.

15. The integrated circuit of claim 10, further comprising a radio frequency (RF) filter device capable of achieving multiple distinct capacitance values based on multiple two-dimensional electron gas (2DEG) configurations in the first and third layers.

16. A computing system including the integrated circuit of claim 10.

17. An integrated circuit comprising:
    a first layer including nitrogen and at least one of gallium and indium;
    a second layer above the first layer, the second layer including gallium and nitrogen, wherein the first and second layers are directly adjacent layers, with no intervening layer between the first and second layers;

a third layer above the second layer, the third layer including aluminum and nitrogen; and a structure at least above the third layer, the structure including one or more metals;

wherein electron gas is inducible in each of the first and second layers, to collectively provide a three-dimensional electron gas (3DEG) configuration.

18. The integrated circuit of claim 17, further comprising:

a fourth layer at least in part between the third layer and the structure, the fourth layer including one or more dielectrics; and a first region and a second region, the second layer laterally between the first and second regions, wherein the first and second regions include nitrogen and at least one of indium and gallium.

19. The integrated circuit of claim 17, wherein the first layer and the second layer, in combination, provide a channel structure, and the first layer includes compositional grading that increases concentration of an element included in the first layer from a low concentration near the bottom of the first layer to a high concentration near the top of the first layer, and wherein the element having the graded concentration is not present in the second layer.

20. The integrated circuit of claim 17, wherein:

indium is graded from a first concentration near a bottom portion of the first layer to a second concentration near a top portion of the first layer, the first concentration being less than the second concentration;

gallium is graded from a third concentration near the bottom portion of the first layer to a fourth concentration near the top portion of the first layer, the third concentration being greater than the fourth concentration; and the second layer consists essentially of gallium and nitrogen.

* * * * *